US008749262B2

(12) United States Patent
Jung et al.

(10) Patent No.: US 8,749,262 B2
(45) Date of Patent: Jun. 10, 2014

(54) DISPLAY DEVICE AND METHOD OF TESTING THE SAME

(75) Inventors: Myung-Sook Jung, Yongin (KR); SungMin Kim, Yongin (KR); Jeonggeun Yoo, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 271 days.

(21) Appl. No.: 13/194,823

(22) Filed: Jul. 29, 2011

(65) Prior Publication Data

US 2012/0161805 A1 Jun. 28, 2012

(30) Foreign Application Priority Data

Dec. 27, 2010 (KR) ........................ 10-2010-0135627

(51) Int. Cl.
*G01R 31/26* (2006.01)

(52) U.S. Cl.
USPC ................. 324/760.01; 324/760.02; 324/691; 324/538; 349/40; 349/41; 349/42; 345/173; 345/174

(58) Field of Classification Search
USPC ............... 324/760.02, 762.01, 538, 421, 525, 324/691; 349/40–42, 149–152; 345/55, 345/173, 174
See application file for complete search history.

(56) References Cited

U.S. PATENT DOCUMENTS

| | | | | |
|---|---|---|---|---|
| 7,251,010 | B2 * | 7/2007 | Miyasaka | 349/151 |
| 7,787,096 | B2 * | 8/2010 | Ohgiichi et al. | 349/152 |
| 2003/0189686 | A1 * | 10/2003 | Hirosue et al. | 349/149 |
| 2005/0168456 | A1 * | 8/2005 | Nakayama et al. | 345/204 |
| 2005/0248713 | A1 * | 11/2005 | Hirosue et al. | 349/158 |
| 2006/0012743 | A1 * | 1/2006 | Yun et al. | 349/149 |
| 2006/0033852 | A1 * | 2/2006 | Kim | 349/38 |
| 2007/0018680 | A1 * | 1/2007 | Jeon et al. | 324/770 |
| 2008/0251787 | A1 * | 10/2008 | Kim | 257/48 |
| 2009/0251387 | A1 * | 10/2009 | Yarita et al. | 345/55 |
| 2009/0310051 | A1 * | 12/2009 | Kim | 349/40 |
| 2010/0181572 | A1 * | 7/2010 | Lee et al. | 257/59 |
| 2011/0018571 | A1 * | 1/2011 | Kim et al. | 324/760.02 |

FOREIGN PATENT DOCUMENTS

| | | | |
|---|---|---|---|
| KR | 10-2004-0057692 | A | 7/2004 |
| KR | 10-2010-0066237 | A | 6/2010 |

* cited by examiner

*Primary Examiner* — Tung X Nguyen
*Assistant Examiner* — Thang Le
(74) *Attorney, Agent, or Firm* — Christie, Parker & Hale, LLP

(57) ABSTRACT

A display device and a method of testing the display device. The display device includes a substrate including both a display region on which pixel cells are located and a peripheral region; test pads, main pins connected to the pixel cells, and dummy pins that are respectively connected to the test pads, the test pads, the main pins, and the dummy pins being on the peripheral region of the substrate, and visual test lines on the peripheral region of the substrate. The visual test lines include a first portion connected to the main pins and a second portion connected to the test pads, and the first and second portions are disconnected from each other.

11 Claims, 8 Drawing Sheets

DISPLAY DEVICE AND METHOD OF TESTING THE SAME

CROSS-REFERENCE TO RELATED APPLICATION

This application claims priority to and the benefit of Korean Patent Application No. 10-2010-0135627, filed in the Korean Intellectual Property Office, on Dec. 27, 2010, the entire content of which is incorporated herein by reference.

BACKGROUND

1. Field

The following description relates to a display device and a method of testing the same.

2. Description of Related Art

Display devices (that are light in weight, slim in thickness, and have low power consumption) are widely used and/or demanded in a variety of electronic products such as televisions, computers, and small-sized electronic devices such as portable terminals and personal digital assistants (PDAs). Since the display devices are used in the variety of electronic devices and industrial fields, an increasing need exists for display devices having high reliability.

Such a display device may include a display panel and a driving circuit for driving pixel cells included in a display panel. When an electrical connection between the pixel cells and the driving circuit is unstable, reliability of the display device may be deteriorated.

SUMMARY

Aspects of embodiments of the present invention are directed toward a display device having high reliability and a method of testing the display device.

Aspects of embodiments of the present invention are directed toward a display device that can be tested to determine whether or not the mounting of a driving circuit is defective and a method of testing the display device.

Aspects of embodiments of the present invention are directed toward a display device and a method of testing the display device, which are designed and/or configured for low price.

An embodiment of the present invention provides a display device including: a substrate including both a display region on which pixel cells are disposed and a peripheral region; test pads, main pins connected to the pixel cells, and dummy pins that are respectively connected to the test pads, the test pads, the main pins, and the dummy pins being on the peripheral region of the substrate; and visual test lines disposed on the peripheral region of the substrate, wherein the visual test lines include a first portion connected to the main pins and a second portion connected to the test pads, and the first and second portions are disconnected from each other.

In one embodiment, the display devices further include a driving circuit mounted on the peripheral region, wherein the driving circuit may include main bumps respectively connected to the main pins, and dummy bumps respectively connected the dummy pins.

In one embodiment, the dummy bumps are electrically connected to each other.

In one embodiment, main pins are disposed between the dummy pins.

In one embodiment, the dummy pins include first and second dummy pins located (disposed) at one side of the main pins, and third and fourth dummy pins located (disposed) at the other side of the main pins.

In one embodiment, the dummy pins are disposed between the main pins.

In one embodiment, the display devices further include data lines and gate lines crossing the data lines, the data lines and the gate lines being located (disposed) on the display region of the substrate and crossed to each other, and the main pins are connected to at least one of the data lines or the gate line.

In one embodiment, the dummy pins are provided during the same process for forming the main pins.

In one embodiment, the first and second portions are disconnected by laser.

In one embodiment, the visual test lines include switching devices for selectively connecting the first and second portions to each other and for selectively disconnecting the first and second portions from each other.

In one embodiment, each of the pixel cells includes a thin film transistor, and the switching devices are provided during the same process for forming the thin film transistor.

Another embodiment of the present invention provides a method of testing a display device. The method includes: preparing a substrate including both a display region on which pixel cells are located (disposed) and a peripheral region, wherein test pads, main pins connected to the pixel cells, dummy pins connected to the test pads, and visual test lines connecting the main pins to the test pads are located (disposed) on the peripheral region of the substrate; disconnecting the visual test lines to interrupt electrical connection between the main pins and the test pads; mounting a driving circuit for driving the pixel cells on the peripheral region; and measuring resistance between the test pads.

In one embodiment, the driving circuit includes main bumps and dummy bumps connected to each other, and the mounting of the driving circuit includes respectively connecting the main bumps to the main pins, and respectively connecting the dummy bumps to the dummy pins.

In one embodiment, the measuring of the resistance between the test pads includes testing whether or not the mounting of the driving circuit is defective.

In one embodiment, the method further includes, before the visual test lines are disconnected from each other, applying a test voltage to the test pads in order to transmit the test voltage to the pixel cells.

In one embodiment, the mounting of the driving circuit includes mounting the driving circuit on the peripheral region, in a chip on glass (COG) process.

In one embodiment, the disconnecting of the visual test lines includes irradiating laser onto the visual test lines.

In one embodiment, the visual test lines include switching devices, and the disconnecting of the visual test lines includes turning off the switching devices.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention In the drawings.

DETAILED DESCRIPTION

Figure 1:
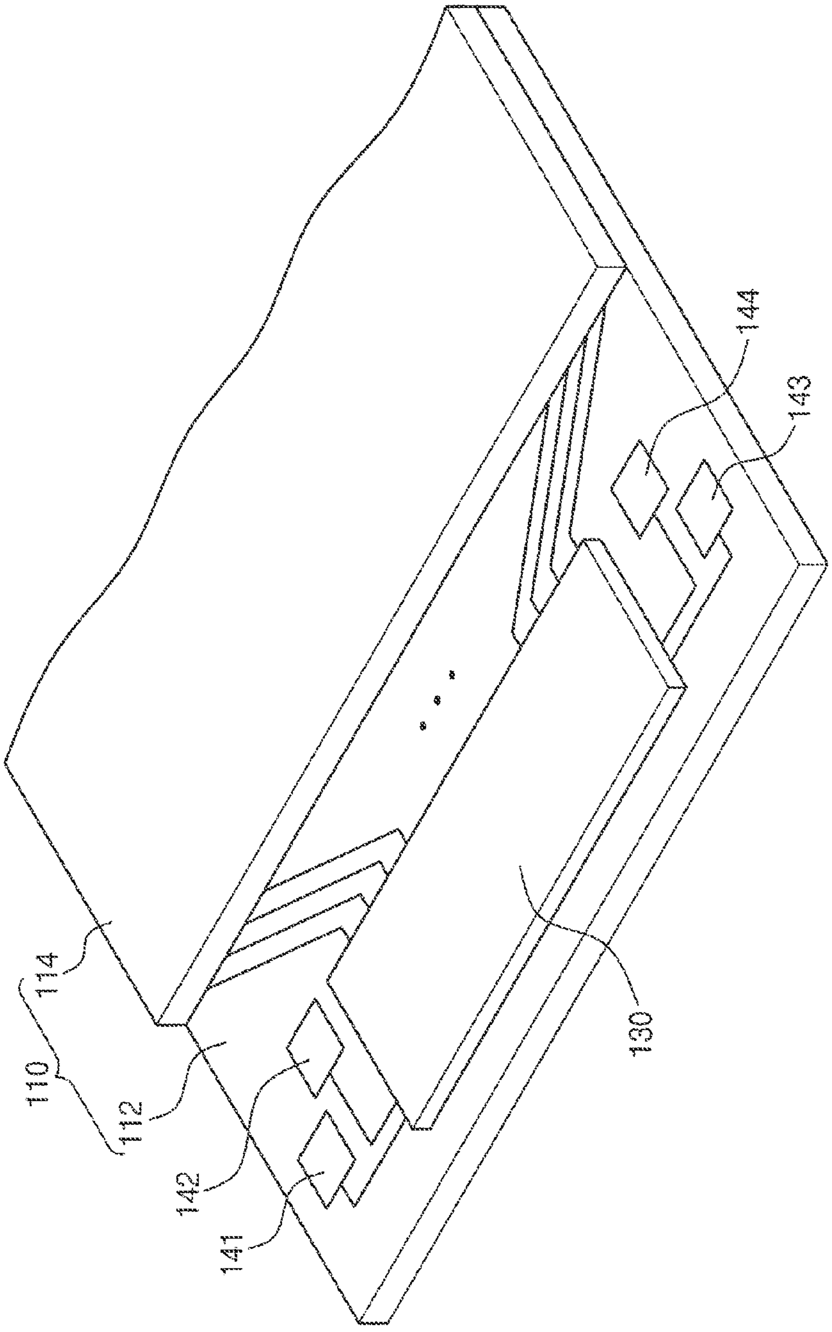
FIG. 1 is a perspective view for explaining a display device and a method of testing the display device according to an embodiment of the present invention.

Objects, other objects, characteristics, and advantages of the present invention will be easily understood from an explanation of embodiments that will be described in more detail below by reference to the attached drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

An embodiment described and exemplified herein includes a complementary embodiment thereof. The word 'and/or' refers to one or more or a combination of relevant constituent elements is possible. In the drawings, like reference numerals refer to like elements throughout.

A display device and a method of testing the display device according to an embodiment will be described.

FIG. 1 is a perspective view for explaining both the display device and the method of testing the display device according to an embodiment of the present invention.

Referring to FIG. 1, a display device according to an embodiment includes a display panel 110, a driving circuit 130, and test pads 141 to 144 (i.e., 141, 142, 143, and 144).

The display panel 110 may include a lower substrate 112 and an upper substrate 114 disposed on the lower substrate 112. The display panel 110 may include a display region and a peripheral region. The display region may be a region in which a plurality of pixel cells are disposed, and the peripheral region may be a region in which a driving circuit 130 for driving the plurality of pixel cells is disposed. The pixel cells may not be disposed in the peripheral region. The peripheral region may include a portion of the lower substrate 112 which is not covered by the upper substrate 114.

The driving circuit 130 may include a data driving unit and a scan driving unit.

Figure 2:
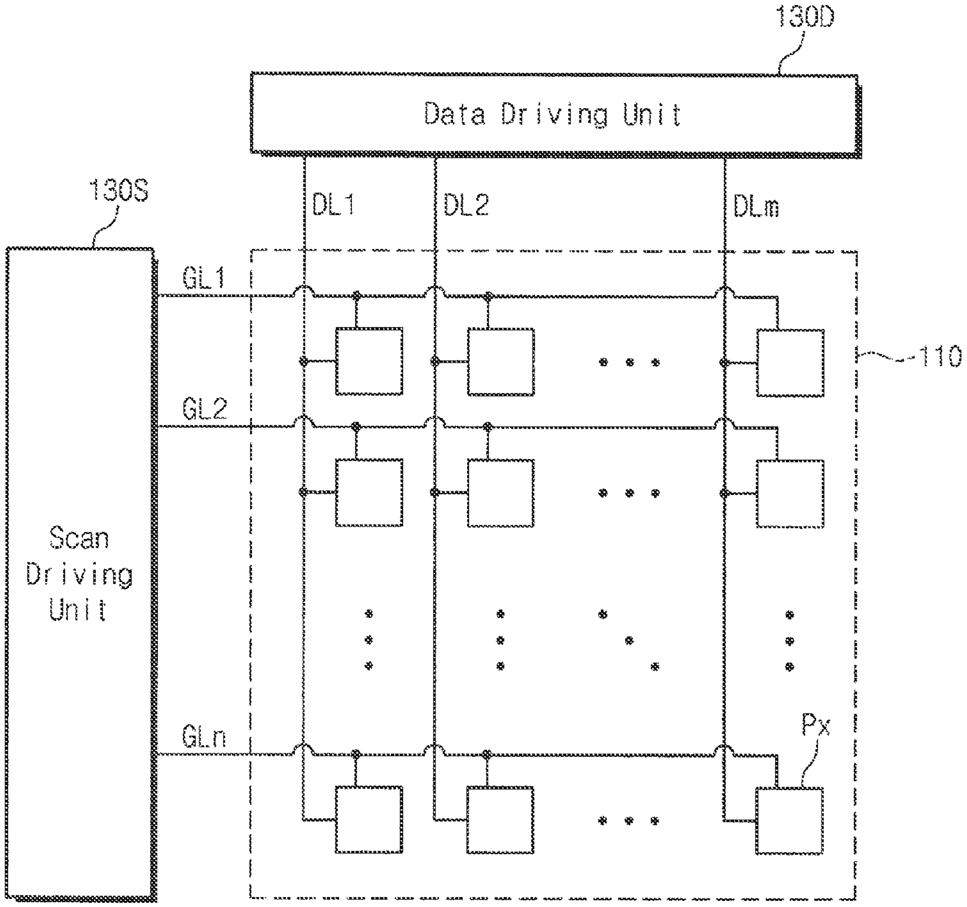
FIG. 2 is a circuit diagram for explaining a display panel and a driving circuit included in the display device according to an embodiment of the present invention.
Figure 3:
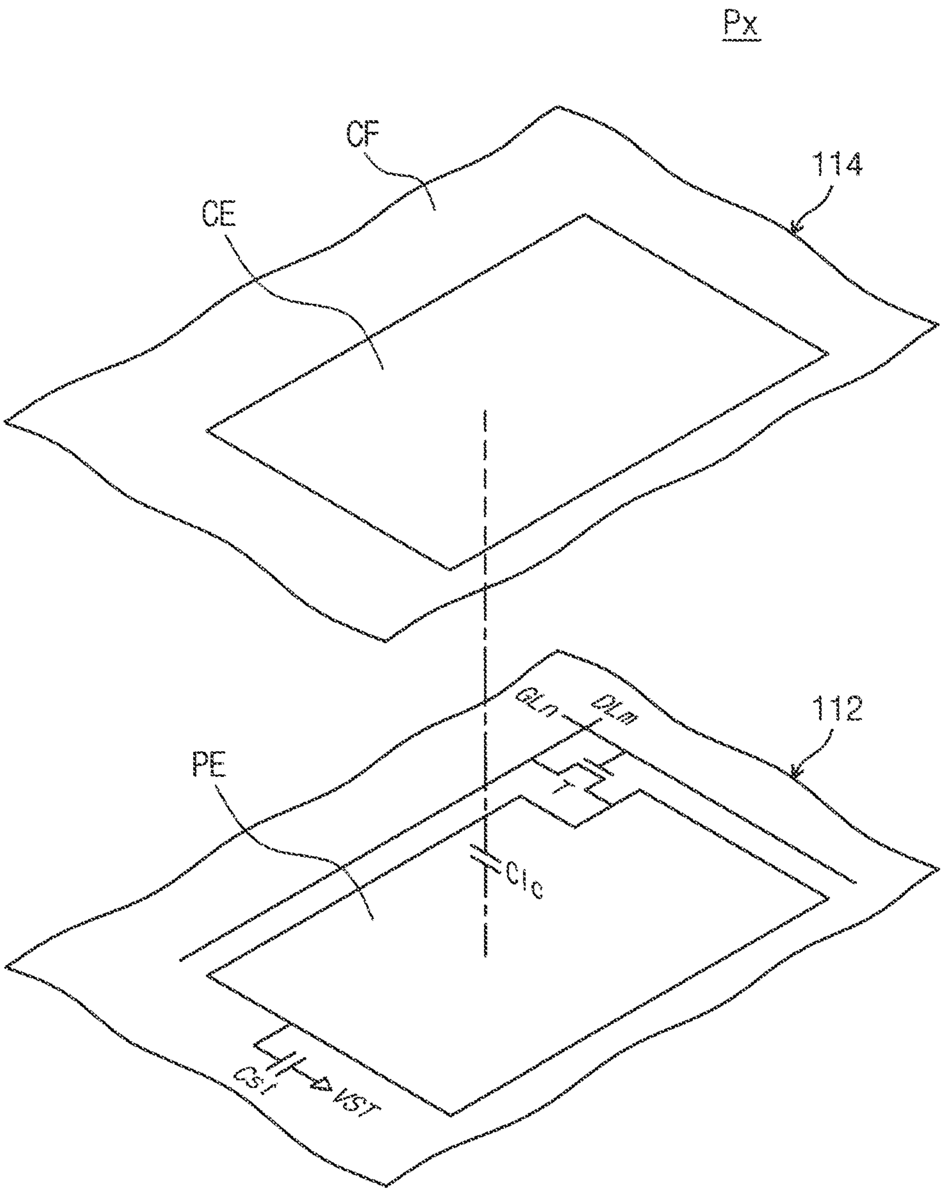
FIG. 3 is a view for explaining a pixel cell included in the display device according to an embodiment of the present invention.

The data driving unit and the scan driving unit may transmit signals (for driving the pixel cells included in the display panel 110) to the pixel cells. This will be described in more detail with reference to FIGS. 2 and 3. FIG. 2 is a circuit diagram for explaining both a display panel and a driving circuit included in the display device according to an embodiment of the present invention, and FIG. 3 is a view for explaining a pixel cell included in the display device according to an embodiment of the present invention. FIG. 3 is a view illustrating an example of pixel cells PX of the display panel 110 of FIG. 2. For brief description, a pixel cell connected to an n-th gate line GLn and an m-th data line DLm is illustrated.

Referring to FIGS. 2 and 3, the display panel 110 may include a plurality of gate lines GL1 to GLn extending in a first direction and a plurality of data lines DL1 to DLm extending in a second direction. The second direction may be perpendicular to or may cross the first direction. The plurality of gate lines GL1 to GLn and the plurality of data lines DL1 to DLm may be disposed on the lower substrate 112. A liquid crystal layer may be disposed between the lower substrate 112 and the upper substrate 114.

The display panel 110 may include the pixel cells PX connected to one gate line and one data line. The plurality of pixel cells PX extending in the first direction may constitute columns, and the plurality of pixel cells extending in the second direction may constitute rows. The pixel cells PX included in the same column may be connected to the same gate line, and the pixel cells PX included in the same row may be connected to the same data line. The gate lines GL1 to GLn may extend between the columns adjacent to each other, and the data lines DL1 to DLm may extend between the rows adjacent to each other.

Each of the pixel cells PX may include a transistor T connected to the data line DLm, and a liquid crystal capacitor Clc and storage capacitor Cst which are connected to the transistor T.

For example, in the transistor T, a control terminal may be connected to the n-th gate line GLn, and an input terminal may be connected to the m-th data line DLm. Also, an output terminal may be connected to the liquid crystal capacitor Clc and the storage capacitor Cst. The liquid crystal capacitor Clc may include two terminals, i.e., a pixel electrode PE of the lower substrate 112 and a common electrode CE of the upper substrate 114. The liquid crystal layer disposed between the pixel electrode PE and the common electrode CE may serve as a dielectric. The pixel electrode PE may be connected to the transistor T, and the common electrode CE may be disposed on an entire surface of the upper substrate 114 to receive a common voltage.

The storage capacitor Cst may include a lower electrode disposed on the lower substrate 112, an upper electrode disposed on the lower electrode and connected to the pixel electrode PE, and an insulator disposed between the lower and upper electrodes.

Each of the pixel cells PX may display one of a red color, a green color, and a blue color. A color filter CF for displaying one of the red color, the green color, and the blue color may be disposed on a portion of the upper substrate 114 corresponding to the pixel electrode PE.

The scan driving unit 130S may select one of the plurality of gate lines GL1 to GLn to apply a gate voltage to the selected gate line. The scan driving unit 130S may adjust a timing of the gate voltage applied into the gate lines GL1 to GLn. For example, the scan driving unit 130S may sequentially apply the gate voltage from the first gate line GL1 to the n-th gate line GLn. Switching transistors included in the pixel cells PX (that are connected to the gate line to which the gate voltage is applied) may be turned on. Also, switching transistors included in the pixel cells PX (that are connected to the non-selected gate lines to which the gate voltage is not applied) may be turned off. The transistors included in the pixel cells PX (that are connected to the same gate line) may be turned on or off at the same time.

The data driving unit 130D may convert the pixel data signal into an analog voltage to supply a data output voltage to the data lines DL1 to DLm. The data output voltage may be transmitted into the pixel electrode PE of each of the pixel cells.

The liquid crystal layer between the pixel electrode PE and the common electrode CE may be driven by a difference between the data output voltage applied to the pixel electrode PE of the liquid crystal capacitor Clc and the common voltage applied to the common electrode CE. Thus, gray levels of the pixel cells PX may be adjusted to output image light.

Referring again to FIG. 1, the test pads 141 to 144 may be disposed on the peripheral region adjacent to the driving circuit 130. The test pads 141 to 144 may perform a visual test of the display panel 110. In addition, the test pads 141 to 144 may test whether or not the mounting of the driving circuit 130 is defective. This will be described with reference to FIGS. 4A and 4B.

Figure 4A:
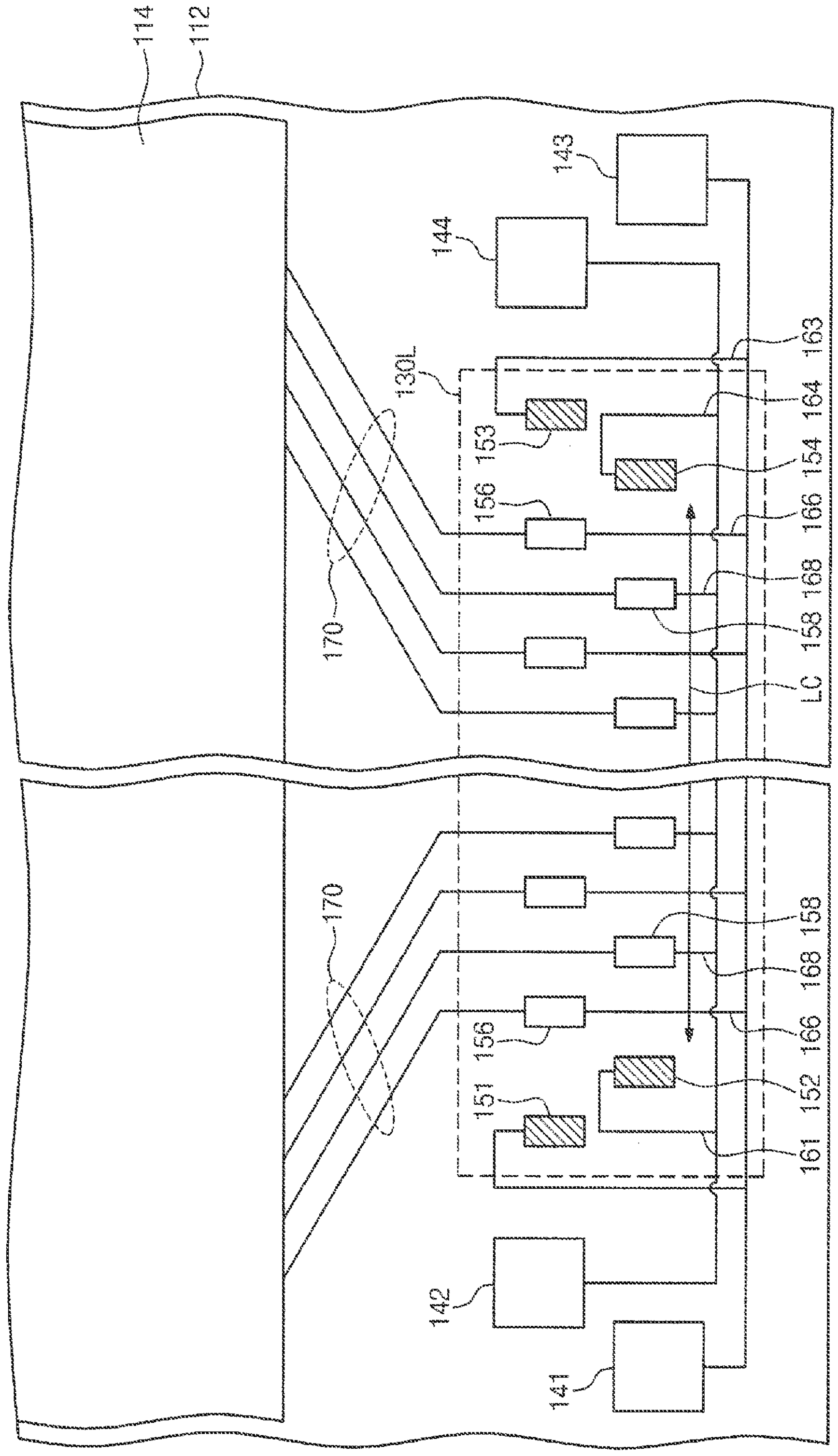
FIG. 4A is a view of a peripheral region before a driving circuit is mounted on a lower substrate included in a display device according to an embodiment of the present invention.
Figure 4B:
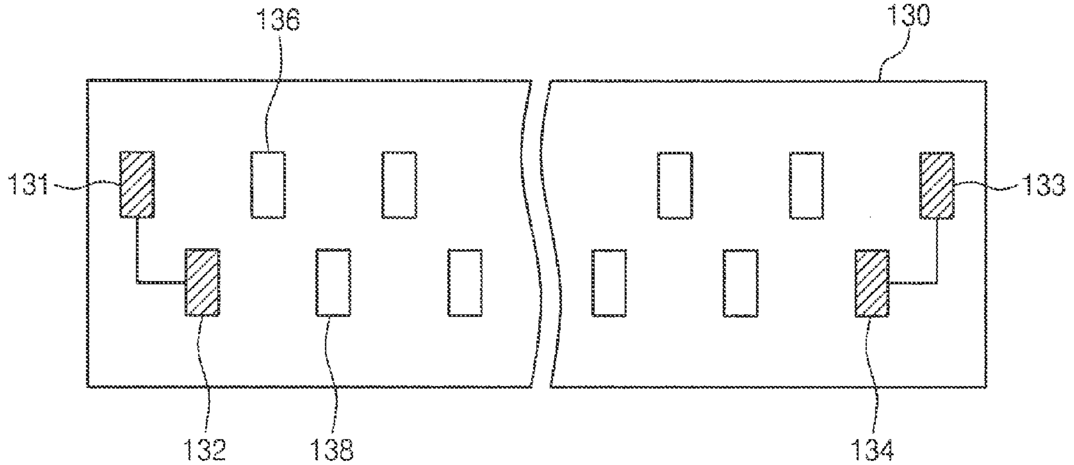
FIG. 4B is a view of bumps included in the driving circuit according to an embodiment of the present invention.

FIG. 4A is a view of a peripheral region before a driving circuit is mounted on a lower substrate included in a display device according to an embodiment of the present invention, and FIG. 4B is a view of bumps included in the driving circuit according to an embodiment of the present invention. FIG. 4B illustrates bumps included in the driving circuit according to an embodiment of the present invention.

Referring to FIGS. 4A and 4B, a plurality of pins 151 to 154 (i.e., 151, 152, 153, and 154), 156, and 158 may be disposed in a driving circuit disposition region 130L of the lower substrate 112 on which the driving circuit is disposed. The plurality of pins 151 to 154, 156, and 158 may include main pins 156 and 158 and dummy pins 151 to 154. The main pins 156 and 158 may be disposed between the dummy pins 151 to 154. That is, the dummy pins 151 and 154 may be disposed on both sides of the main pins 156 and 158. The main pins 156 and 158 and the dummy pins 151 to 154 may be provided during the same process. Thus, the main pins 156 and 158 and the dummy pins 151 to 154 may be formed of the same material.

The main pins 156 and 158 may be connected to the main lines 170, respectively. The main lines 170 may be one of the data lines DL1 to DLm or the gate lines GL1 to GLn, which are described with reference to FIG. 2. Alternatively, the main lines 170 may be lines connected to at least one of the data lines DU to DLm or the gate lines GL1 to GLn, which are described with reference to FIG. 2. The main pins 156 and 158 may be connected to the pixel cells PX of FIG. 2 through the main lines 170. The dummy pins 151 to 154 may not be connected to the main lines 170. In this case, the dummy pins 151 to 154 may not be connected to the pixel cells PX described with reference to FIG. 2.

The test pads 141 to 144 may be disposed around the driving circuit disposition region 130L. The test pads 141 to 144 may not be disposed within the driving circuit disposition region 130L. The test pads 141 to 144 may be connected to the main pins 156 and 158 by visual test lines 166 and 168. For example, the first main pins 156 may be connected to a first test pad 141 and a third test pad 143 by the first visual test lines 166, and the second main pins 158 may be connected to a second test pad 142 and a fourth test pad 144 by the second visual test lines 168. The first to fourth test pads 141 to 144 may be connected to the first to fourth dummy pins 151 to 154 by first to fourth to fourth mounting test lines 161 to 164 (i.e., 161, 162, 163, and 164), respectively. Although the four dummy pins 151 to 154 are illustrated in drawings, the number of dummy pins may be under or over four.

A visual test may be performed before the driving circuit 130 is mounted on the driving circuit disposition region 130L. For example, a test voltage may be applied to the test pads 141 to 144. The test voltage applied to the test pads 141 to 144 may be transmitted into the main pins 156 and 158 and the dummy pins 151 to 154 through the visual test lines 166 and 168 and the mounting test lines 161 to 164. The test voltage transmitted into the main pins 156 and 158 may be transmitted into the pixel cells PX described with reference to FIG. 2 through the main lines 170, and then the pixel cells PX may output light in response to the test voltage. As a result, it may be tested whether the pixel cells are normally operated.

After the visual test is performed, the visual test lines 166 and 168 connecting the main pins 156 and 158 to the test pads 141 to 144 may be disconnected to interrupt electrical connection between the main pins 156 and 158 and the test pads 141 to 144. Thus, each of the visual test lines 166 and 168 may include a first portion connected to the main pins 156 and 158 and a second portion connected to the test pads 141 to 144. In this case, the first and second portions may be disconnected from each other. According to an embodiment, the visual test lines 166 and 168 may be cut along a laser cutting line LC using laser. As described above, when the visual test lines 166 and 168 are disconnected using the laser, a fused trace may be found at the disconnected portions of the visual test lines 166 and 168 irradiated by the laser.

Unlike the visual test lines 166 and 168, the mounting test lines 161 to 164 may not be disconnected. Thus, after the visual test lines 166 and 168 are disconnected, the mounting test lines 161 to 164 may connect the dummy pins 151 to 154 to the test pads 141 to 144.

After the visual test lines 166 to 168 are disconnected, the driving circuit 130 may be mounted on the driving circuit disposition region 130L. The driving circuit 130 may be mounted on the driving circuit disposition region 130L in a chip on glass (COG) process. A plurality of bumps 131 to 134 (i.e., 131, 132, 133, and 134), 136, and 138 may be disposed on a back surface of the driving circuit 130.

The plurality of bumps 131 to 134, 136, and 138 may include main bumps 136 and 138 and dummy bumps 131 to 134, which are disposed on positions corresponding to those of the main pins 156 and 158 and the dummy pins 151 to 154. For example, the main bumps 136 and 138 may be disposed between the dummy bumps 131 to 134. Thus, the first and second main bumps 136 and 138 may be electrically connected to the first and second main pins 156 and 158, respectively. The first to fourth dummy bumps 131 to 134 may be electrically connected to the first to fourth dummy pins 151 to 154, respectively. The plurality of bumps 131 to 134, 136, and 138 may be connected to the plurality of pins 151 to 154, 156, and 158 using a conductive adhesion film.

The dummy bumps 131 to 134 may be electrically connected to each other. For example, the first and second dummy bumps 131 and 132 disposed at one side of the main bumps 136 and 138 may be electrically connected to each other. Also, the third and fourth dummy bumps 133 and 134 disposed at the other side of the main bumps 136 and 138 may be electrically connected to each other.

After the driving circuit 130 is mounted on the driving circuit disposition region 130 L in the COG process, resistance between the test pads 141 to 144 may be measured. For example, resistance between the first and second test pads 141 and 142 may be measured, and resistance between the third and fourth test pads 143 and 144 may be measured. According to an embodiment, probes of a multimeter may respectively contact the test pads 141 to 144 to measure the resistance between the test pads 141 to 144. The resistance between the test pads 141 to 144 may be measured such that an electrical connection between the plurality of pins 151 to 154, 156, and 158 and the plurality of bumps 131 to 134, 136 and 138 may be tested.

For example, when the resistance between the first and second test pads 141 and 142 is high, an electrical connection between the first and second dummy pins 151 and 152 and the first and second dummy bumps 131 and 32 may be electrically unstable (instable). In this case, poor contact between the first and second dummy pins 151 and 152 and the first and second dummy bumps 131 and 32 may occur. Thus, it may be determined that the poor contact occurs at portions of the driving circuit 130 adjacent to the first and second dummy bumps 131 and 132. Similarly, when the resistance between the third and fourth test pads 143 and 144 is high, it may be determined that the poor contact occurs at positions of the driving circuit 130 adjacent to the third and fourth dummy bumps 133 and 134.

On the other hand, when the resistance between the first and second test pads 141 and 142 and the resistance between the third and fourth test pads 143 and 144 are low, an electrical connection between the dummy pins 151 to 154 and the dummy bumps 131 to 134 may be stable. In this case, it may be determined that the mounting of the driving circuit 130 is good.

As described above, according to an embodiment of the present invention, a test pad may not be used, but the test pad used for the visual test may be used to test whether or not the mounting of the driving circuit 130 is defective. Thus, the display device and the method of testing the display device, which together have high reliability and are designed/configured for low price, may be provided.

In the display device and the method of testing the display device according to an embodiment of the present invention, the main pins are disposed between the dummy pins, and the dummy pins are located (disposed) between the dummy bumps. On the other hand, the dummy pins may be disposed between the main pins, and the dummy bumps may be disposed between the main bumps. This will be described with reference to FIGS. 5A and 5B.

Figure 5A:
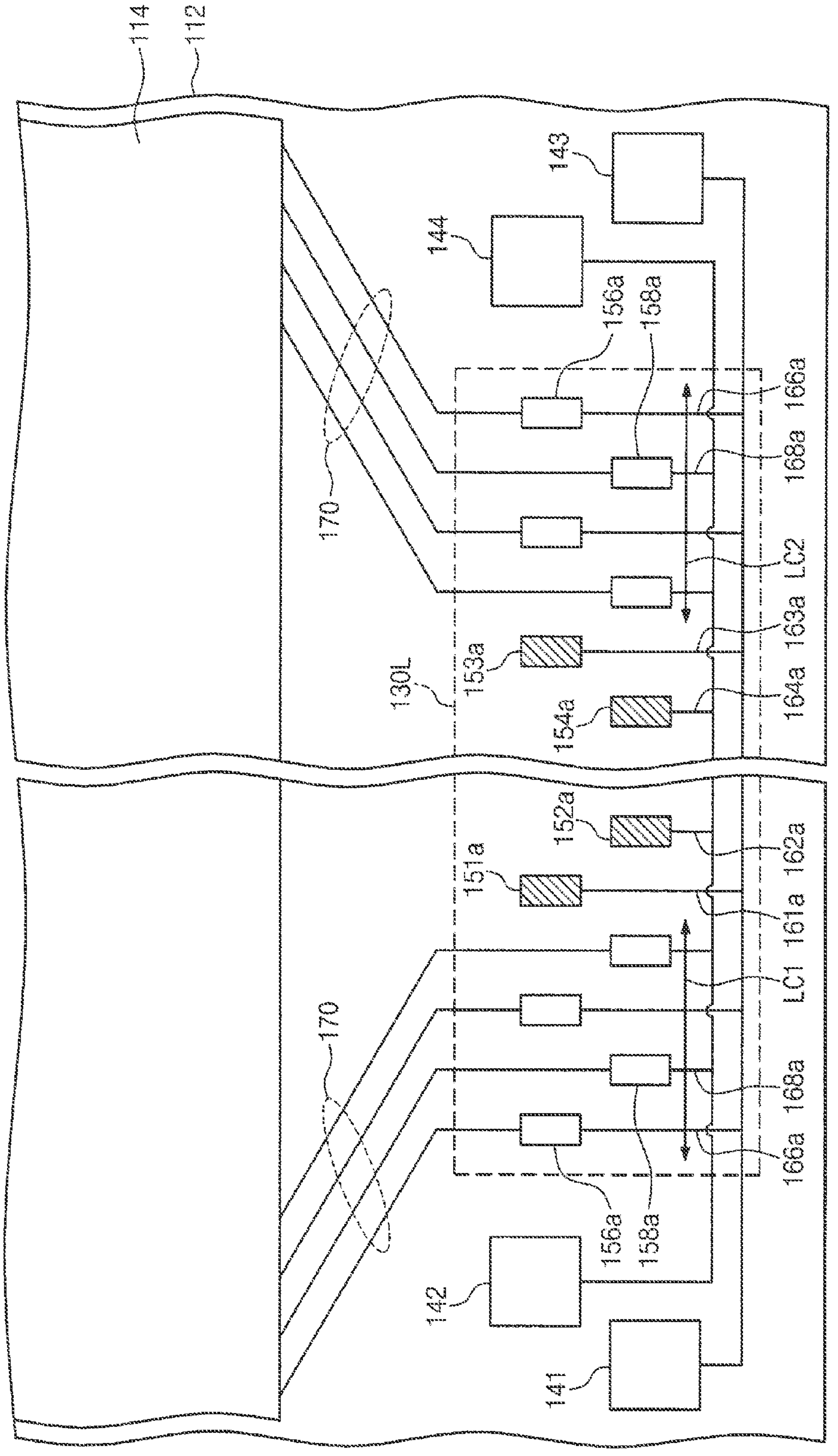
FIG. 5A is a view of a peripheral region before a driving circuit is mounted on a lower substrate included in a display device according to a modified embodiment of the present invention.
Figure 5B:
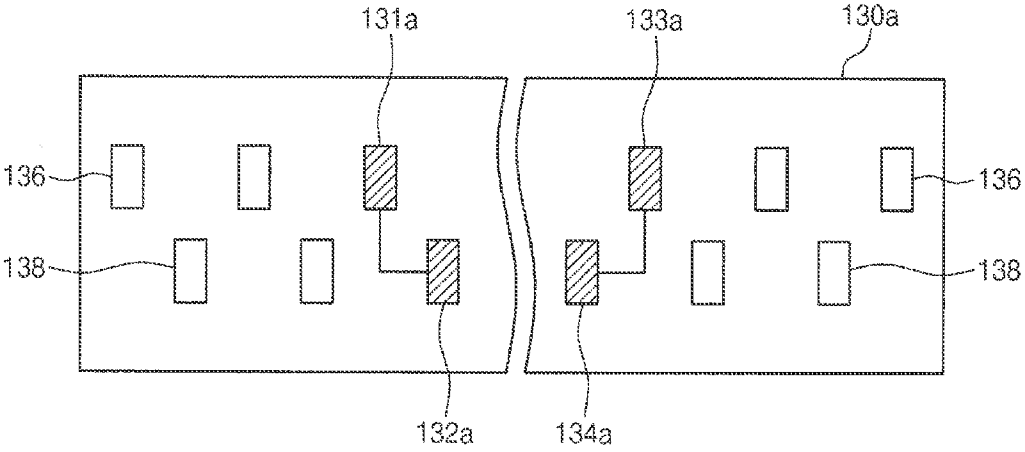
FIG. 5B is a view of bumps included in the driving circuit according to a modified embodiment of the present invention.

FIG. 5A is a view of a peripheral region before a driving circuit is mounted on a lower substrate included in a display device according to a modified embodiment of the present invention, and FIG. 5B is a view of bumps included in the driving circuit according to a modified embodiment of the present invention. FIG. 5B illustrates bumps included in a driving circuit according to a modified embodiment of the present invention.

Referring to FIGS. 5A and 5B, main pins **156*a* and 158*a* and dummy pins 151*a* to 154*a* (i.e., 151*a*, 152*a*, 153*a*, and 154*a*) may be disposed on a driving circuit disposition region 130L of a lower substrate 112 including a driving circuit 130. The dummy pins 151*a* to 154*a* may be disposed between the main pins 156*a* and 158*a*. That is, the main pins 156*a* and 158*a* may be disposed on both sides of the dummy pins 151*a* to 154*a*. The main pins 156*a* and 158*a* may not be disposed between the dummy pins 151*a* to 154*a*. On the other hand, at least one main pin may be disposed between the dummy pins 151*a* to 154*a***.

The main pins **156*a* and 158*a* may be connected to the main lines 170 described with reference to FIGS. 4A and 4B, respectively. Also, the main pins 156*a* and 158*a* may be connected to pixel cells of a display panel. The dummy pins 151*a* and 154*a* may not be connected to the main lines 170**.

As shown in FIGS. 4A and 4B, the test pads 141 to 144 may be disposed around the driving circuit disposition region 130L. The test pads 141 to 144 may be connected to the main pins **156*a* and 158*a* by visual test lines 166*a* and 168*a*. The first to fourth test pads 141 to 144 may be respectively connected to the first to fourth dummy pins 151*a* to 154*a* by first to fourth mounting test lines 161*a* to 164*a***.

Before the driving circuit 130 is mounted on the driving circuit disposition region 130L, as described with reference to FIGS. 4A and 4B, a test voltage may be applied to the test pads 141 to 144 to perform a visual test. After the visual test is performed, the visual test lines **166*a* and 168*a* connecting the main pins 156*a* and 158*a* to the test pads 141 to 144 may be cut along laser cutting lines LC1 and LC2** using laser.

After the visual test lines **166*a* and 168*a* are disconnected, the driving circuit 130 may be mounted on the driving circuit disposition region 130L in a COG process. Main bumps 136*a* and 138*a* and dummy bumps 131*a* to 134*a* (i.e., 131*a*, 132*a*, 133*a*, and 134*a*) corresponding to the main pins 156*a* and 158*a* and the dummy pins 151 to 154 may be disposed on a back surface of the driving circuit 130. The first and second dummy bumps 131*a* and 132*a* may be connected to each other, and the third and fourth dummy bumps 133*a* and 134*a* may be connected to each other. The first and second main bumps 136*a* and 138*a* may be electrically connected to the first and second main pins 156*a* and 158*a*, respectively, and the first to fourth dummy bumps 131*a* to 134*a* may be electrically connected to the first to fourth dummy pins 151*a* to 154*a***, respectively.

Thereafter, resistance between the test pads 141 to 144 may be measured according to the method above-described with reference to FIGS. 4A and 4B to test whether or not mounting of the driving circuit 130 is defective.

In the forgoing embodiments, after the visual test is performed, the visual test lines are disconnected by the laser. Alternatively, the visual test lines may include switching devices. In this case, after the visual test is performed, the switching devices may be turned off. This will be described with reference to FIG. 6.

Figure 6:
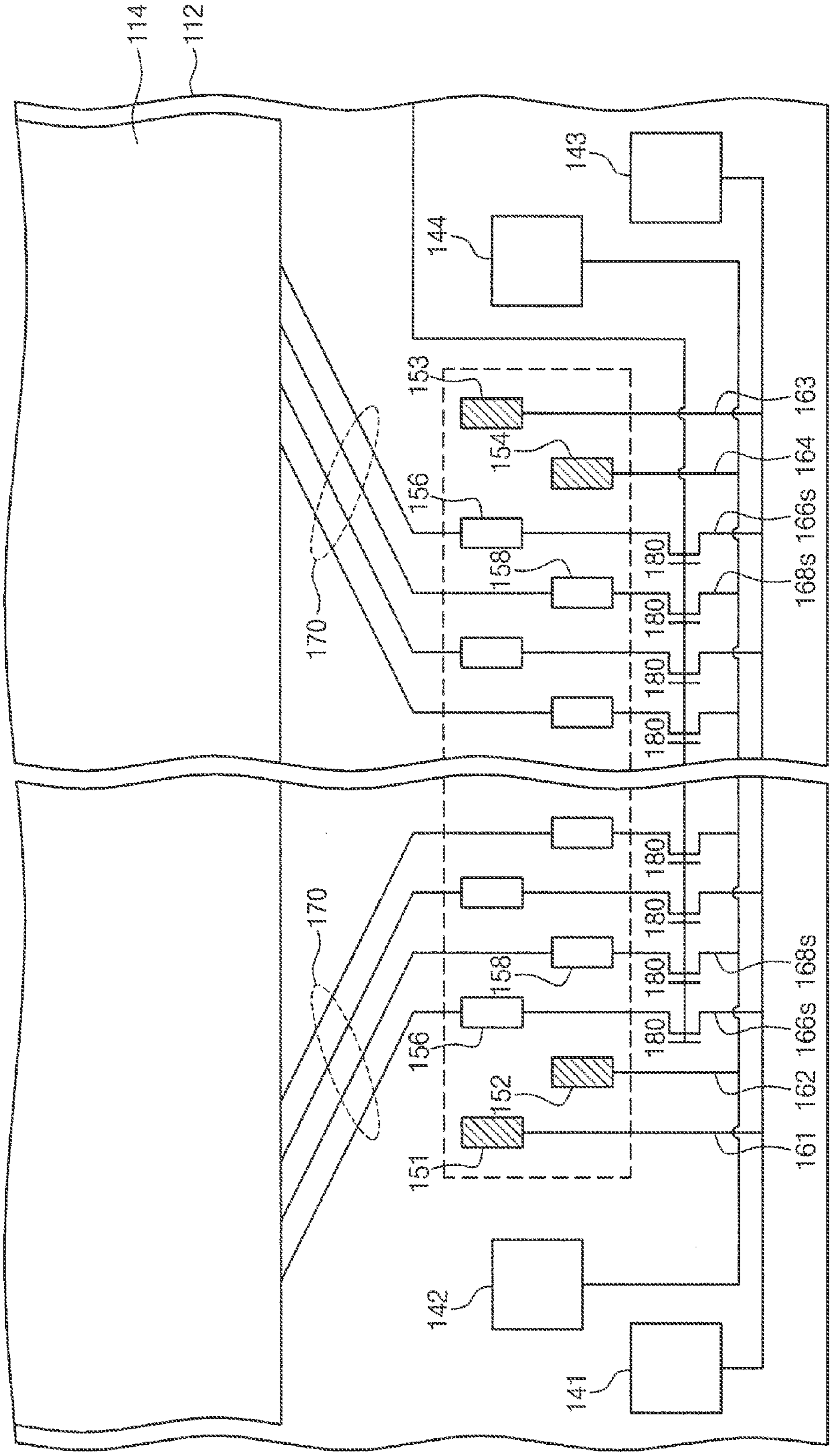
FIG. 6 is a view of a peripheral region before a driving circuit is mounted on a lower substrate included in a display device according to another embodiment of the present invention.

FIG. 6 is a view of a peripheral region before a driving circuit is mounted on a lower substrate included in a display device according to another embodiment of the present invention. Also, FIG. 6 illustrates the peripheral region before a driving circuit is mounted on a lower substrate included in the display device according another embodiment of the present invention.

Referring to FIG. 6, a lower substrate 112 may include a driving circuit disposition region 130L on which the driving circuit 130 described with reference to FIG. 4B is disposed. The main pins 156 and 158 and the dummy pins 151 to 154, which are described with reference to FIG. 4A may be disposed on the driving circuit disposition region 130L. The main pins 156 and 158 may be connected to the main lines 170 described with reference to FIGS. 4A and 4B, respectively. The main pins 156 and 158 may be connected to pixel cells of a display panel.

As described with reference to FIGS. 4A and 4B, the test pads 141 to 144 may be disposed around the driving circuit disposition region 130L. The test pads 141 to 144 may be connected to the main pins 156 and 158 by visual test lines 166S and 168S. The first to fourth test pads 141 to 144 may be connected to the first to fourth dummy pins 151 to 154 by first to fourth mounting test lines 161 to 164, respectively.

Each of the visual test lines 166S and 168S may include switching devices 180. The switching devices 180 may be provided during the same process as each other. The switching device 180 may be thin film transistors disposed on the lower substrate 112. In this case, the switching devices 180 may be provided during the same process as a transistor T included in the pixel cells PX described with reference to FIGS. 2 and 3. Control terminals of the switching devices 180 may be connected to each other.

A test voltage may be applied to the test pads 141 to 144 to perform a visual test as described with reference to FIGS. 4A and 4B. While the visual test is performed, the switching devices 180 included in the visual test lines 166S and 168S may be turned on. Thus, the test pads 141 to 144 may be electrically connected to the main pins 156 and 158. Accordingly, the test voltage applied to the test pads 141 to 144 may be transmitted into the pixel cells PX described with reference to FIGS. 2 and 3 via the visual test lines 166S and 168S, the main pins 156 and 158, and the main lines 170.

As described with reference to FIG. 4B, the driving circuit 130 may be mounted on the driving circuit disposition region 130L in a COG process. After the driving circuit 130 is mounted, the switching devices 180 included in the visual test lines 166S and 168S may be turned off. Accordingly, the visual test lines 166S and 168S may be disconnected, and thus, the test pads 141 to 144 and the main pins 156 and 158 may not be electrically connected to each other. On the other hand, before the driving circuit 130 is mounted, the switching devices 180 may be turned off.

Thereafter, in the state where the switching devices 180 are turned off, resistance between the test pads 141 to 144 may be measured according to the method described with reference to FIGS. 4A and 4B to test whether or not the mounting of the driving circuit 130 is defective.

In the embodiment described with reference to FIG. 6, although the dummy pins 151 to 154 are disposed on both sides of the main pins 156 and 158, the plurality of pins may be disposed as shown in FIG. 5A.

According to the embodiments of the present invention, the substrate (including both the peripheral region and the display region in which the pixel cells are disposed), the test pads, the main pins, and the dummy pins are prepared. The visual test of the pixel cells is performed through the test pads, and the driving circuit connected to the main pins and the dummy pins is mounted. Also, whether or not the mounting of the driving circuit is defective may be tested through the test pads. Thus, the display device and the method of testing the display device, which together have high reliability and are designed/configured for low price, may be provided.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A display device comprising:

a substrate comprising both a display region on which pixel cells are located and a peripheral region;

test pads, main pins connected to the pixel cells, and dummy pins configured to be respectively connected to the test pads to determine whether the contacts of adjacent portions of a driving circuit for driving the pixel cells is sufficiently connected when the driving circuit is mounted on the peripheral region of the substrate, the test pads, the main pins, and the dummy pins being on the peripheral region of the substrate; and visual test lines on the peripheral region of the substrate, wherein the visual test lines comprise a first portion connected to the main pins and a second portion connected to the test pads, and the first and second portions are disconnected from each other.

2. The display device of claim 1, further comprising a driving circuit mounted on the peripheral region, wherein the driving circuit comprises main bumps respectively connected to the main pins, and dummy bumps respectively connected the dummy pins.

3. The display device of claim 2, wherein the dummy bumps are electrically connected to each other.

4. The display device of claim 1, Wherein the main pins are disposed between the dummy pins.

5. The display device of claim 4, wherein the dummy pins comprise first and second dummy pins located at one side of the main pins, and third and fourth dummy pins located at the other side of the main pins.

6. The display device of claim 1, wherein the dummy pins are located between the main pins.

7. The display device of claim 1, further comprising data lines and gate lines crossing the data lines, the data lines and the gate lines being located on the display region of the substrate, wherein the main pins are connected to at least the data lines or the gate lines.

8. The display device of claim 1, wherein the dummy pins are provided during the same process for forming the main pins.

9. The display device of claim 1, wherein the first and second portions are disconnected by laser.

10. The display device of claim 1, wherein the visual test lines comprise switching devices for selectively connecting the first and second portions to each other and for selectively disconnecting the first and second portions from each other.

11. The display device of claim 10, wherein each of the pixel cells comprises a thin film transistor, and the switching devices are provided during the same process for forming the thin film transistor.

* * * * *

UNITED STATES PATENT AND TRADEMARK OFFICE

CERTIFICATE OF CORRECTION

PATENT NO. : 8,749,262 B2
APPLICATION NO. : 13/194823
DATED : June 10, 2014
INVENTOR(S) : Myung-Sook Jung et al.

It is certified that error appears in the above-identified patent and that said Letters Patent is hereby corrected as shown below:

In the Claims

| | |
|---|---|
| Col. 10, line 23, Claim 2 | Delete "connected the dummy", |
| | Insert --connected to the dummy-- |
| Col. 10, line 26, Claim 4 | Delete "Wherein", |
| | Insert --wherein-- |
| Col. 10, line 38, Claim 7 | Delete "least the data", |
| | Insert --least one of the data-- |

Signed and Sealed this
Ninth Day of August, 2016

Michelle K. Lee
*Director of the United States Patent and Trademark Office*